(12) United States Patent
Huang et al.

(10) Patent No.: US 8,896,200 B2
(45) Date of Patent: Nov. 25, 2014

(54) PIXEL STRUCTURE OF ORGANIC LIGHT EMITTING DISPLAY DEVICE

(71) Applicant: Chunghwa Picture Tubes, Ltd., Taoyuan (TW)

(72) Inventors: Szu-Chi Huang, Changhua County (TW); Chin-Hai Huang, Taoyuan County (TW); Bo-Jhang Sun, Kaohsiung (TW)

(73) Assignee: Chunghwa Picture Tubes, Ltd., Longtan Township, Taoyuan County (TW)

( * ) Notice: Subject to any disclaimer, the term of this patent is extended or adjusted under 35 U.S.C. 154(b) by 0 days.

(21) Appl. No.: 13/845,111

(22) Filed: Mar. 18, 2013

(65) Prior Publication Data

US 2014/0226323 A1   Aug. 14, 2014

(30) Foreign Application Priority Data

Feb. 8, 2013   (TW) .............................. 102105304 A

(51) Int. Cl.
  *H01L 51/52*   (2006.01)
  *F21V 21/00*   (2006.01)
(52) U.S. Cl.
  CPC ...................................... *F21V 21/00* (2013.01)
  USPC .............................. 313/504; 313/505; 257/89

(58) Field of Classification Search
  USPC .................................................. 313/498–512
  See application file for complete search history.

(56) References Cited

U.S. PATENT DOCUMENTS

| | | | |
|---|---|---|---|
| 7,154,456 B1 * | 12/2006 | Saito ............................... | 345/77 |
| 2008/0001536 A1 * | 1/2008 | Tsai et al. ..................... | 313/506 |
| 2010/0117527 A1 | 5/2010 | Ho | |
| 2010/0136221 A1 | 6/2010 | Tsai | |
| 2012/0147314 A1 * | 6/2012 | Yoshizawa et al. ........... | 349/144 |
| 2012/0327338 A1 * | 12/2012 | Kobayashi et al. ........... | 349/106 |
| 2013/0057735 A1 * | 3/2013 | Hirota ........................... | 348/273 |

* cited by examiner

*Primary Examiner* — Donald Raleigh
(74) *Attorney, Agent, or Firm* — Winston Hsu; Scott Margo

(57) ABSTRACT

A pixel structure of an organic light emitting display device includes a substrate and a plurality of display pixel units disposed on the substrate. Each of the display pixel units includes a first sub-pixel, a second sub-pixel and a third sub-pixel disposed adjacently to one another. The first sub-pixel in each of the display pixel units is disposed adjacently to three first sub-pixels respectively disposed in three adjacent display pixel units to form a first pixel unit. The second sub-pixel in each of the display pixel units is disposed adjacently to three second sub-pixels respectively disposed in three adjacent display pixel units to form a second pixel unit. The third sub-pixel in each of the display pixel units is disposed adjacently to three third sub-pixels respectively disposed in three adjacent display pixel units to form a third pixel unit.

5 Claims, 9 Drawing Sheets

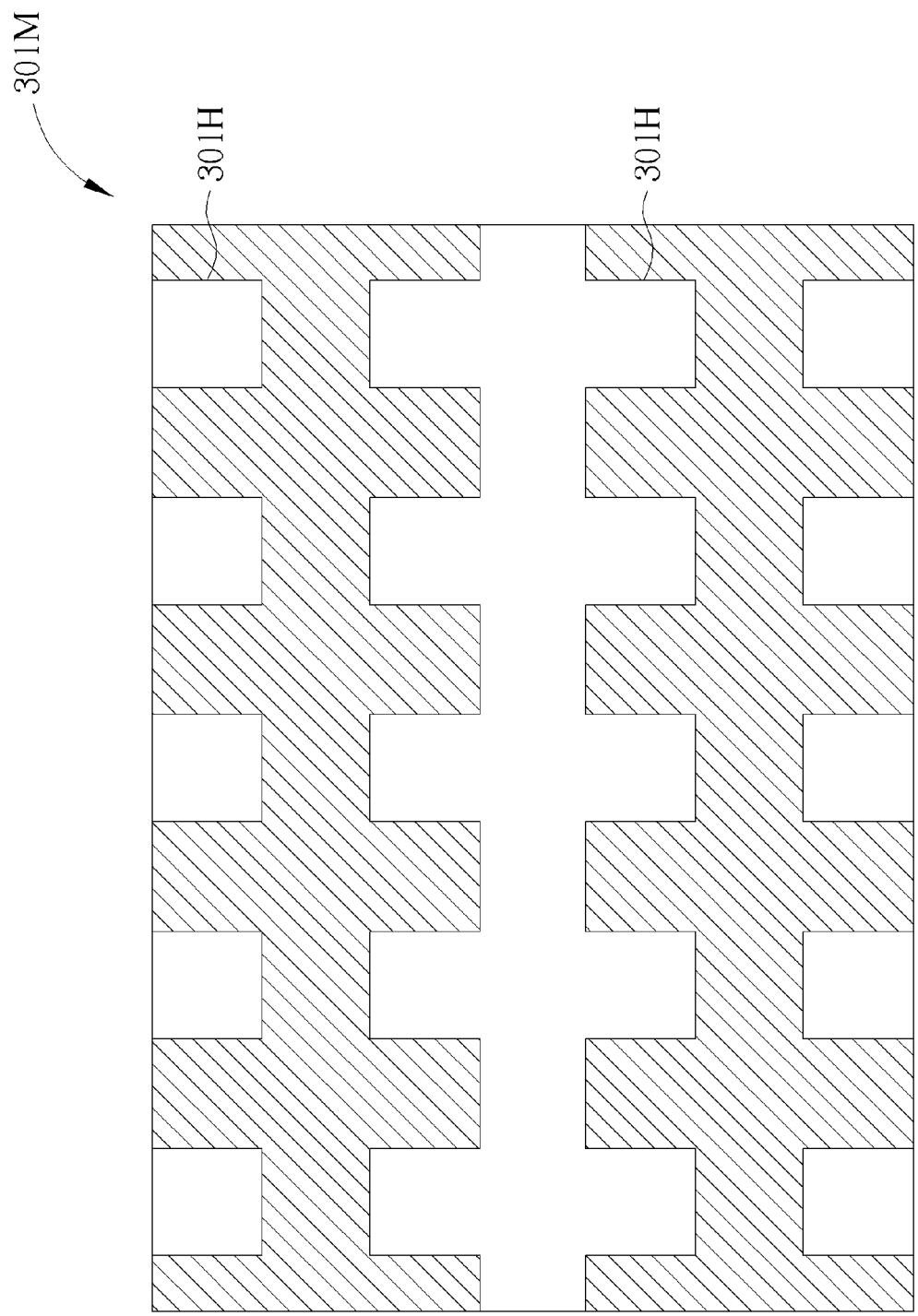

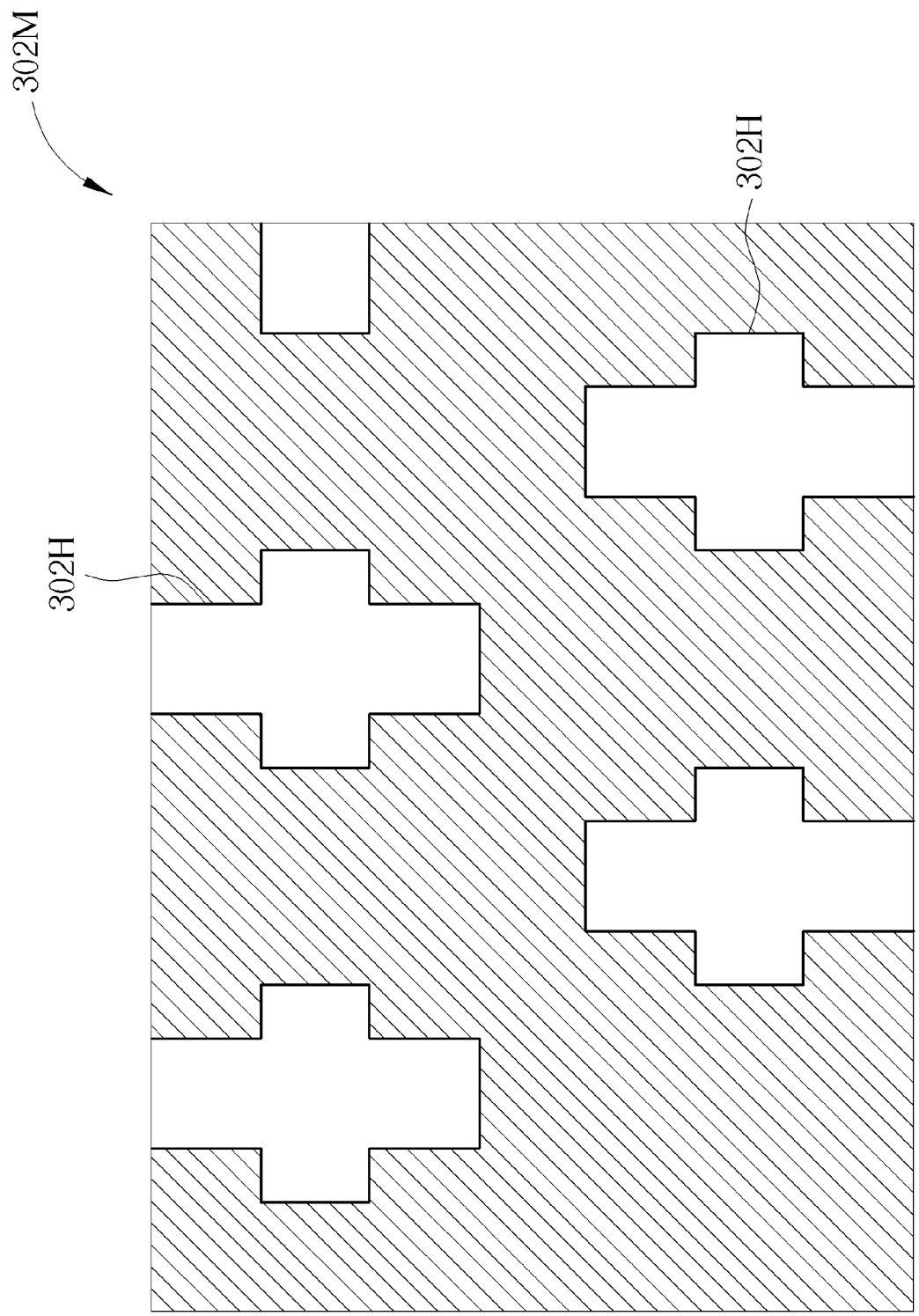

PIXEL STRUCTURE OF ORGANIC LIGHT EMITTING DISPLAY DEVICE

BACKGROUND OF THE INVENTION

1. Field of the Invention

The present invention relates to a pixel structure of an organic light emitting display device and more particularly, to a pixel structure where allocations of the sub-pixels are modified for lowering demands on precisions of masks and enhancing manufacturing process stability of the pixel structure.

2. Description of the Prior Art

Organic light emitting diode displays, which have the advantages of absence of color filter, self-luminescence and low power consumption, is always viewed as the best candidate to substitute for the liquid crystal display and become the main display technology of the next generation.

Please refer to FIG. 1 and FIG. 2. FIG. 1 is a schematic diagram illustrating a conventional organic light emitting diode display device. FIG. 2 is a schematic diagram illustrating a mask used for manufacturing the conventional organic electroluminescent display device. As shown in FIG. 1 and FIG. 2, a mask 100M including stripe openings 100H extending along a column direction Y is used in an evaporation process of organic light emitting materials for manufacturing a pixel structure 100 of a conventional organic light emitting display device. A plurality of blue sub-pixels 120B, a plurality of green sub-pixels 120G and a plurality of red sub-pixels 120R are formed on a substrate 110 by the evaporation process. Each of the blue sub-pixels 120B, each of the green sub-pixels 120G and each of the red sub-pixels 120R are alternately disposed along a row direction X. A display pixel unit 120 is composed of a blue sub-pixel 120B, a green sub-pixel 120G and a red sub-pixel 120R disposed adjacently along the row direction X. This is so-called a stripe type pixel arrangement. In this pixel structure, a specific distance between the stripe openings 100H is required for maintaining sufficient structural strength of the mask 100M to avoid yield loss of the pixel structure 100 caused by process variations and low aligning precision of the manufacturing process. However, the distance between the stripe openings 100H has to be shrunk for higher resolution demand about the pixel structure. Problems such as complicated manufacturing process of the masks and worse stability of the organic light emitting material may become serious accordingly.

SUMMARY OF THE INVENTION

It is one of the objectives of the present invention to provide a pixel structure of an organic light emitting display device. A sub-pixel in each display pixel unit and tree adjacent sub-pixels in the same color are disposed adjacently to one another to compose a pixel unit. Purposes of low precision demands on masks and improved manufacturing process stability may be achieved accordingly.

To achieve the purposes described above, a preferred embodiment of the present invention provides a pixel structure of an organic light emitting display device. The pixel structure of the organic light emitting display device includes a substrate and a plurality of display pixel units. The display pixel units are disposed on the substrate. Each of the display pixel units includes a first sub-pixel, a second sub-pixel and a third sub-pixel disposed adjacently to one another. The first sub-pixel in each of the display pixel units is disposed adjacently to three first sub-pixels respectively disposed in three adjacent display pixel units to form a first pixel unit. The second sub-pixel in each of the display pixel units is disposed adjacently to three second sub-pixels respectively disposed in three adjacent display pixel units to form a second pixel unit. The third sub-pixel in each of the display pixel units is disposed adjacently to three third sub-pixels respectively disposed in three adjacent display pixel units to form a third pixel unit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a schematic diagram illustrating a first mask according to the second preferred embodiment of the present invention.

FIG. 9 is a schematic diagram illustrating a second mask according to the second preferred embodiment of the present invention.

DETAILED DESCRIPTION

Figure 1:
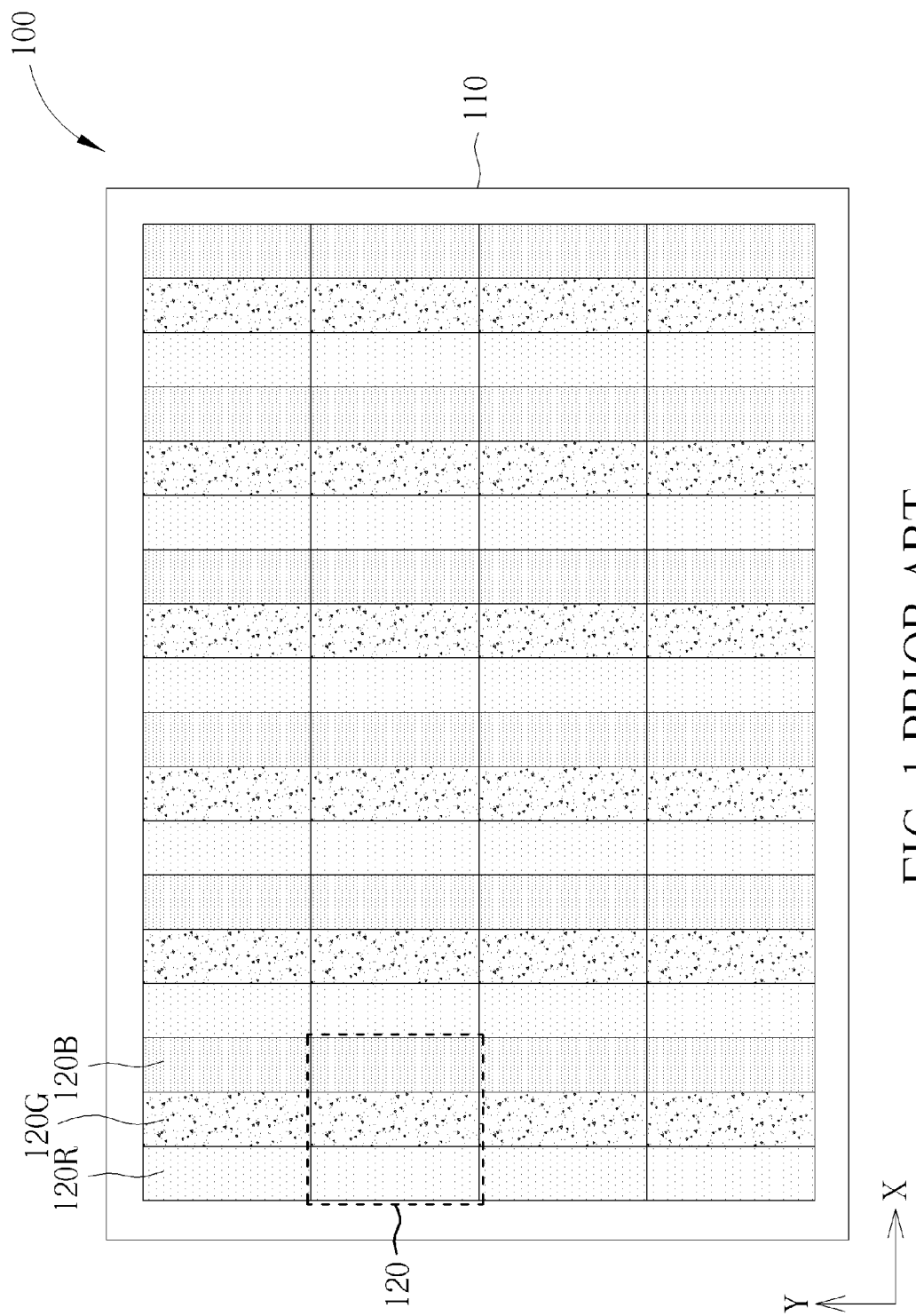
FIG. 1 is a schematic diagram illustrating a conventional organic light emitting diode display device.
Figure 2:
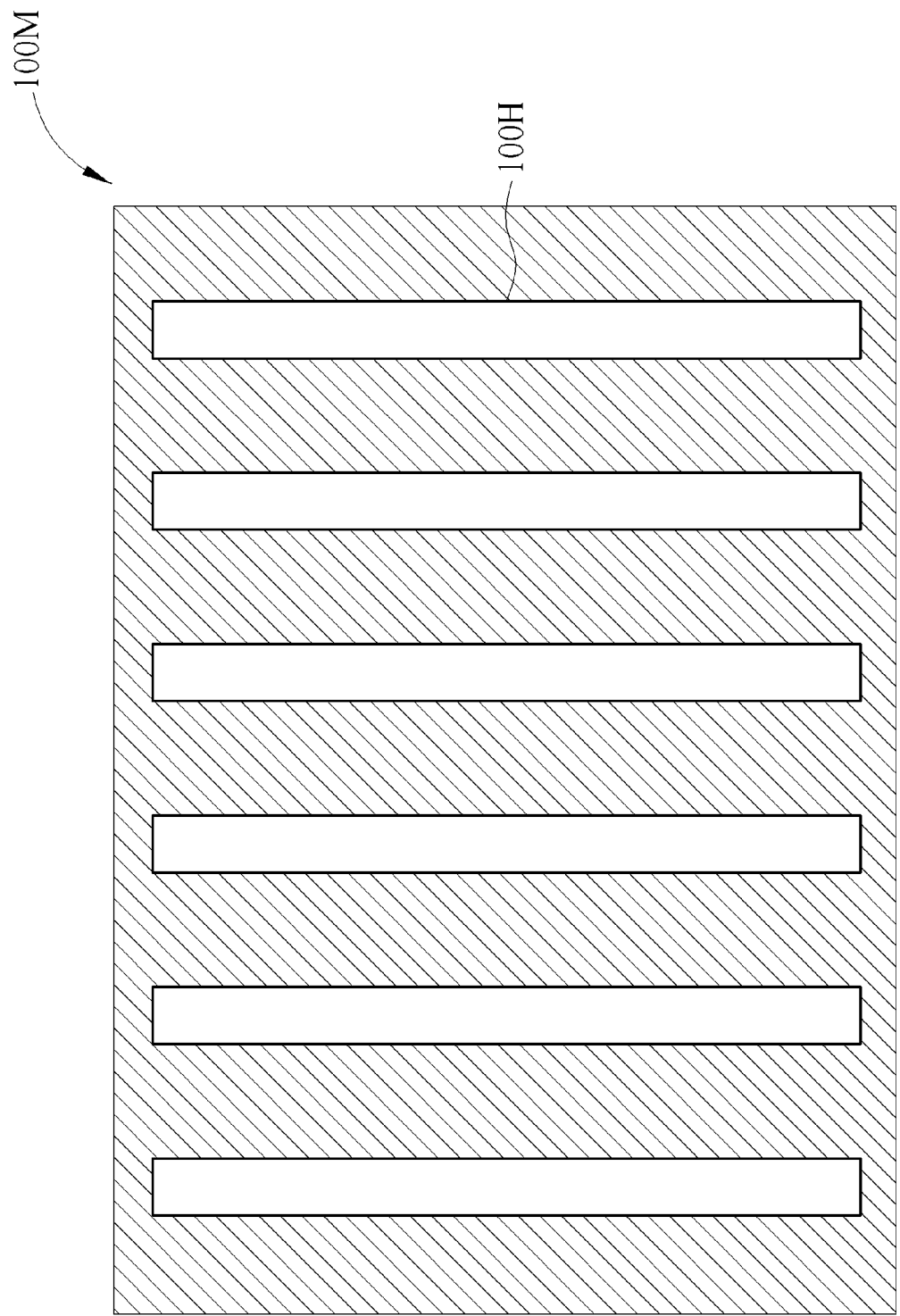
FIG. 2 is a schematic diagram illustrating a mask used for manufacturing the conventional organic electroluminescent display device.
Figure 3:
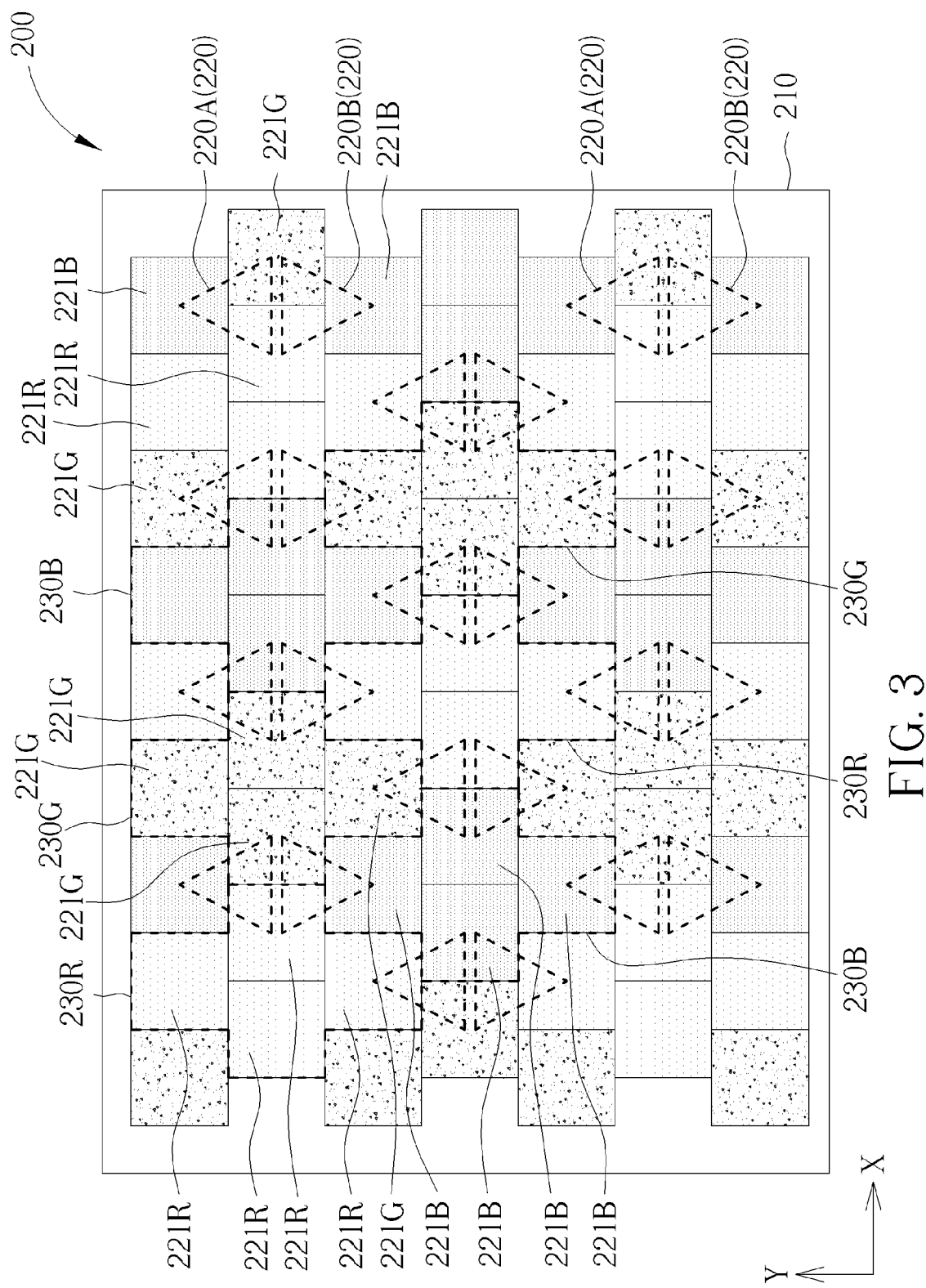
FIG. 3 is a schematic diagram illustrating a pixel structure of an organic light emitting display device according to a first preferred embodiment of the present invention.
Figure 4:
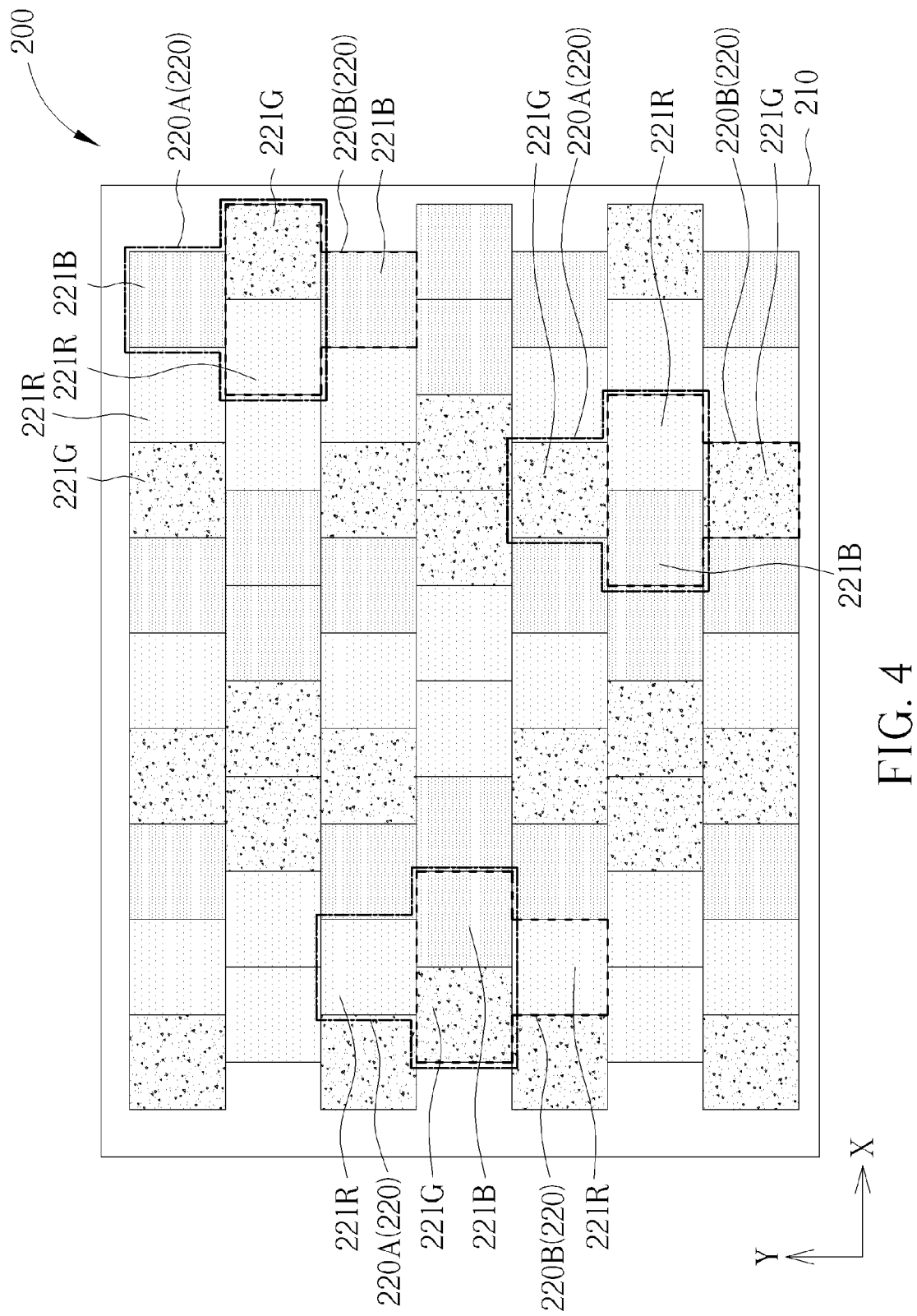
FIG. 4 is a schematic diagram illustrating an arrangement of display pixel units in the pixel structure of the organic light emitting display device according to the first preferred embodiment of the present invention.
Figure 5:
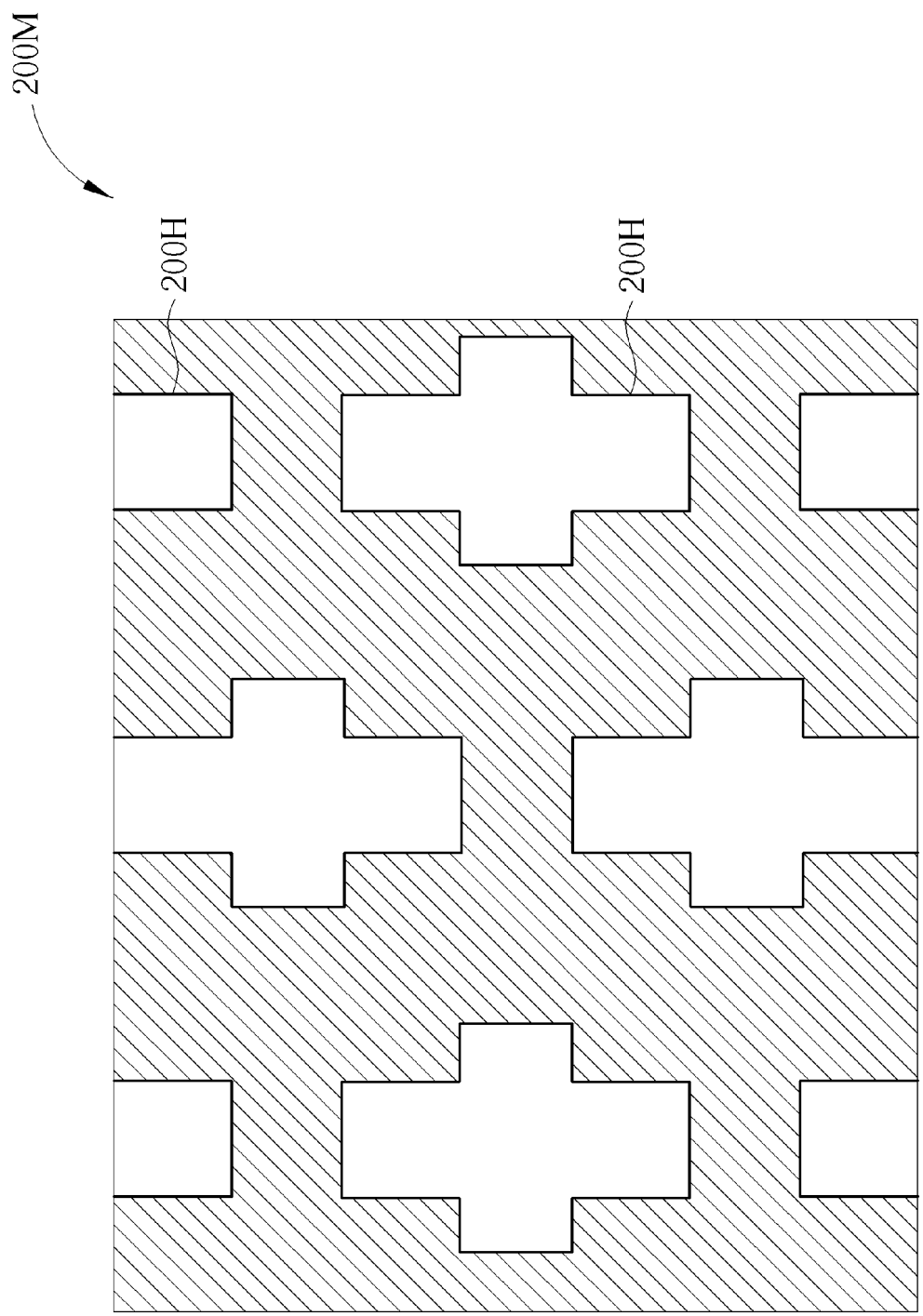
FIG. 5 is a schematic diagram illustrating a mask according to the first preferred embodiment of the present invention.

Please refer to FIGS. 3-5. FIG. 3 is a schematic diagram illustrating a pixel structure of an organic light emitting display device according to a first preferred embodiment of the present invention. FIG. 4 is a schematic diagram illustrating an arrangement of display pixel units in the pixel structure of the organic light emitting display device according to this embodiment. FIG. 5 is a schematic diagram illustrating a mask in this embodiment. Please note that the figures are only for illustration and the figures may not be to scale. The scale may be further modified according to different design considerations. As shown in FIG. 3 and FIG. 4, a pixel structure 200 of an organic light emitting display device is provided in this embodiment. The pixel structure 200 includes a substrate 210 and a plurality of display pixel units 220. The display pixel units 220 are disposed on the substrate 210. Each of the display pixel units 220 includes a first sub-pixel 221R, a second sub-pixel 221G and a third sub-pixel 221B disposed adjacently to one another. In this embodiment, each of the display pixel units 220 is composed of one of the first sub-pixels 221R, one of the second sub-pixels 221G and one of the third sub-pixels 221B. Each of the first sub-pixels 221R is preferably a red sub-pixel, each of the second sub-pixels 221G is preferably a green sub-pixel and each of the third sub-pixels 221B is preferably a blue sub-pixel to presenting required display effects by color mixing in each of the display pixel units 220, but not limited thereto. In other preferred embodiments of the present invention, each of the display pixel units 220 may also be composed of sub-pixels in other colors or in other different amounts to generate required display effects by combining the sub-pixels in each of the display pixel units 220.

In this embodiment, the first sub-pixel 221R, the second sub-pixel 221G and the third sub-pixel 221B in each of the display pixel units 220 are preferably aligned in a delta formation, but not limited thereto. The first sub-pixel 221R in each of the display pixel units 220 is disposed adjacently to three first sub-pixels 221R respectively disposed in three adjacent display pixel units 220 to form a first pixel unit 230R. The second sub-pixel 221G in each of the display pixel units 220 is disposed adjacently to three second sub-pixels 221G respectively disposed in three adjacent display pixel units 220 to form a second pixel unit 230G. The third sub-pixel 221B in each of the display pixel units 220 is disposed adjacently to three third sub-pixels 221B respectively disposed in three adjacent display pixel units 220 to form a third pixel unit 230B. In other words, each of the first pixel units 230R is composed of four first sub-pixels 221R disposed adjacently to one another, each of the second pixel units 230G is composed of four second sub-pixels 221G disposed adjacently to one another, each of the third pixel units 230B is composed of four third sub-pixels 221B disposed adjacently to one another. At least some of the first sub-pixels 221R are directly connected to three first sub-pixels 221R along a row direction X and a column direction Y. At least some of the second sub-pixels 221G are directly connected to three second sub-pixels 221G along the row direction X and the column direction Y. At least some of the third sub-pixels 221B are directly connected to three third sub-pixels 221B along the row direction X and the column direction Y. The row direction X is preferably perpendicular to the column direction Y, but not limited thereto. Additionally, the first sub-pixels 221R in each of the first pixel units 230R are preferably aligned in a rhombus formation, the second sub-pixels 221G in each of the second pixel units 230G are preferably aligned in a rhombus formation. The third sub-pixels 221B in each of the third pixel units 230B are preferably aligned in a rhombus formation.

As shown in FIGS. 3-5, in the pixel structure 200 of this embodiment, the first pixel units 230R, the second pixel units 230G and the third pixel units 230B may be formed by evaporation processes of different organic light emitting materials through openings 200H in a mask 200M. In other words, each of the openings 200H may be used to form one first pixel unit 230R, one second pixel unit 230G, or one third pixel unit 230B. In this embodiment, the first pixel units 230R are disposed separately from one another, the second pixel units 230G are disposed separately from one another and the third pixel units 230B are disposed separately from one another. Therefore, a distance between the openings 200H may become longer and purposes of lowering complication of manufacturing the mask 200M and improving stability of the evaporation process mentioned above may be achieved accordingly.

It is worth noting that, as shown in FIG. 3 and FIG. 4, at least one of the first sub-pixels 221R and at least one of the second sub-pixels 221G are shared by two adjacent display pixel units 220, at least one of the second sub-pixels 221G and at least one of the third sub-pixels 221B are shared by two adjacent display pixel units 220 and at least one of the first sub-pixels 221R and at least one of the third sub-pixels 221B are shared by two adjacent display pixel units 220. More specifically, the pixel structure 200 in this embodiment may include a plurality of first display pixel units 220A and a plurality of second display pixel units 220B. Each of the first display pixel units 220A is composed of a first sub-pixel 221R, a second sub-pixel 221G and a third sub-pixel 221B aligned in a delta formation. Each of the second display pixel units 220B is composed of a first sub-pixel 221R, a second sub-pixel 221G and a third sub-pixel 221B aligned in a delta formation. The difference between each of the first display pixel units 220A and each of the second display pixel units 220B is that the first sub-pixel 221R, the second sub-pixel 221G and the third sub-pixel 221B in each of the first display pixel units 220A are aligned in a delta or a triangle formation. The first sub-pixel 221R, the second sub-pixel 221G and the third sub-pixel 221B in each of the second display pixel units 220B are aligned in an inverted triangle formation. Each of the first display pixel units 220A is disposed correspondingly to one of the second display units 220B and each of the first display pixel units 220A shares some of the sub-pixels with the corresponding second display pixel unit 220B. In other words, each of the first display pixel units 220A partially overlaps the corresponding second display pixel unit 220B. For example, the first sub-pixel 221R and the second sub-pixel 221G in at least one of the first display pixel units 220A may be shared by one corresponding second display pixel unit 220B, the second sub-pixel 221G and the third sub-pixel 221B in at least one of the first display pixel units 220A may be shared by one corresponding second display pixel unit 220B and the first sub-pixel 221R and the third sub-pixel 221B in at least one of the first display pixel units 220A may be shared by one corresponding second display pixel unit 220B. A display resolution of the pixel structure 200 in this embodiment may then be enhanced without increasing the actual number of the sub-pixels.

In this embodiment, an area of the first sub-pixel 221R, an area of the second sub-pixel 221G and an area of the third sub-pixel 221B are preferably equal to one another. Center points of each first sub-pixel 221R, each second sub-pixel 221G and each third sub-pixel 221B disposed adjacently to one another along the row direction X are preferably located on a straight line. Center points of each first sub-pixel 221R, each second sub-pixel 221G and each third sub-pixel 221B disposed adjacently to one another along the column direction Y preferably deviate from one another. The first sub-pixels 221R, the second sub-pixels 221G and the third sub-pixels 221B disposed adjacently to one another along the row direction X at the upmost part in FIG. 3 and FIG. 4 may be defined as a first row. Accordingly, the first sub-pixels 221R, the second sub-pixels 221G and the third sub-pixels 221B disposed in a second row are shared by the first display pixel units 220A and the second display pixel unit 220B. The display conditions in the shared first sub-pixels 221R, the shared second sub-pixels 221G and the shared third sub-pixels 221B may be calculated by a specific algorithm to present required display effects from the first display pixel units 220A and the second display pixel unit 220B with the sub-pixels unshared in the first display pixel units 220A and the second display pixel unit 220B. The pixel structure 200 of the organic light emitting display device in this embodiment may be used to provide normal display images with the sub-pixel sharing design described above and the display resolution may be accordingly enhanced.

Figure 6:
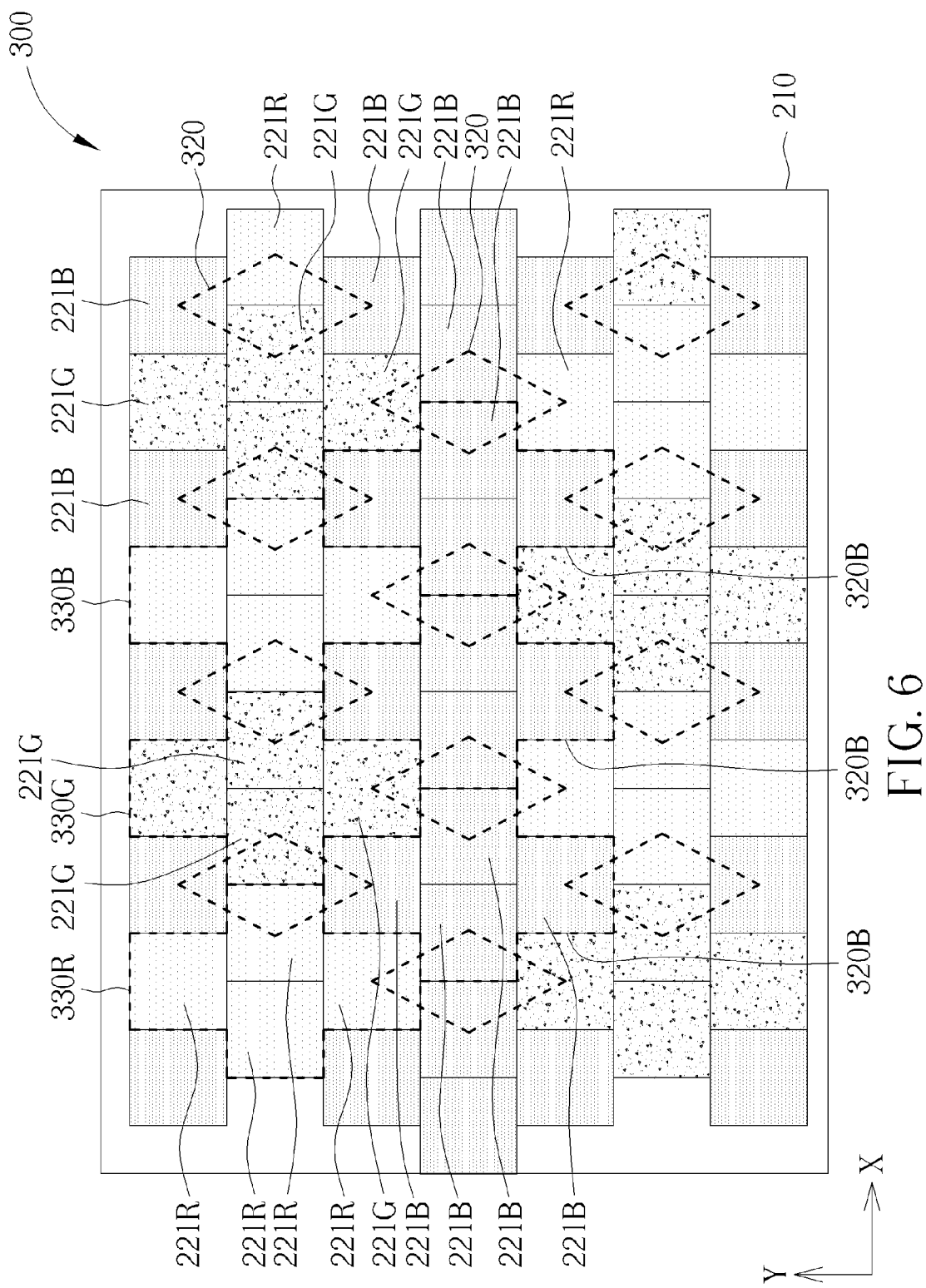
FIG. 6 is a schematic diagram illustrating a pixel structure of an organic light emitting display device according to a second preferred embodiment of the present invention.
Figure 7:
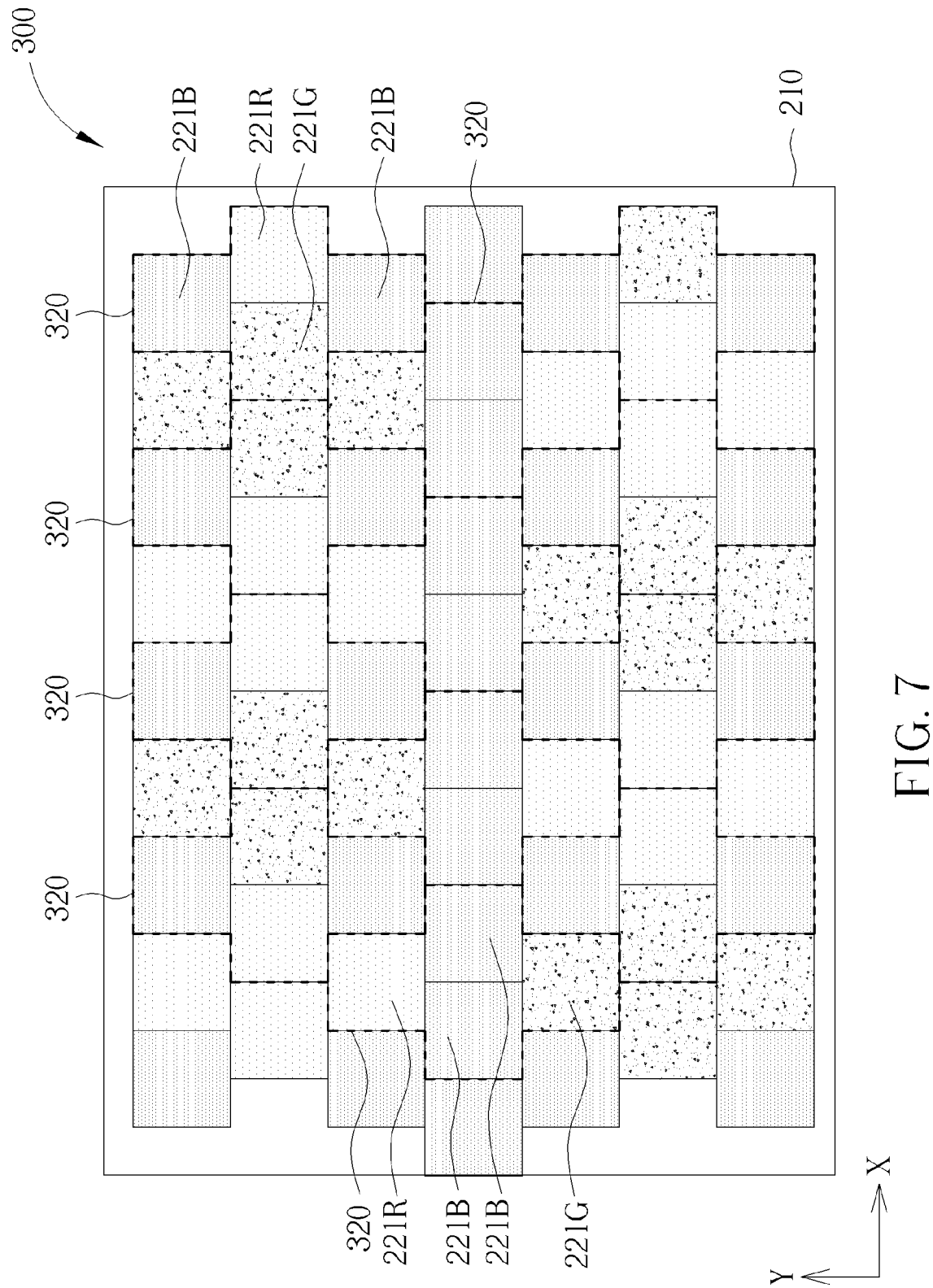
FIG. 7 is a schematic diagram illustrating an arrangement of display pixel units in the pixel structure of the organic light emitting display device according to the second preferred embodiment of the present invention.

Please refer to FIGS. 6-9. FIG. 6 is a schematic diagram illustrating a pixel structure of an organic light emitting display device according to a second preferred embodiment of the present invention. FIG. 7 is a schematic diagram illustrating an arrangement of display pixel units in the pixel structure of this embodiment. FIG. 8 is a schematic diagram illustrating a first mask in this embodiment. FIG. 9 is a schematic diagram illustrating a second mask in this embodiment. As shown in FIG. 6 and FIG. 7, a pixel structure 300 of an organic light emitting display device is provided in this embodiment. The pixel structure 300 includes a substrate 210 and a plurality of display pixel units 320 disposed on the substrate 210. The difference between the second preferred embodiment and the first preferred embodiment is that each of the display pixel units 320 is composed of one of the first sub-pixels 221R, one of the second sub-pixels 221G and two of the third sub-pixels 221B. Each of the first sub-pixels 221R is preferably a red sub-pixel, each of the second sub-pixels 221G is preferably a green sub-pixel and each of the third sub-pixels 221B is preferably a blue sub-pixel, but not limited thereto. A luminous efficiency of each of the third sub-pixels 221B is preferably lower than a luminous efficiency of each of the first sub-pixels 221R and a luminous efficiency of each of the second sub-pixels 221G, but not limited thereto. Each of the display pixel units 320 includes two third sub-pixels 221B with the relatively lower luminous efficiency. A uniformity of the luminous efficiency between the sub-pixels in each display pixel unit 320 may be improved by compensation without changing relative sizes or operating currents of the first sub-pixel 221R, the second sub-pixel 221G and the third sub-pixel 221B in each of the display pixel unit 320. In other words, the difference in luminous efficiency between the sub-pixels in each display pixel unit 320 may be compensated under the condition that an area of the first sub-pixel 221R, an area of the second sub-pixel 221G and an area of the third sub-pixel 221B are substantially equal to one another and this is favorable for driving circuit designs and demands of higher display resolution. It is worth noting that the third sub-pixel 221B in this embodiment is preferably a sub-pixel with a relatively lower luminous efficiency, but the third sub-pixel 221B is not limited to a blue sub-pixel. In each of the display pixel units 320, a number of other color sub-pixels with a relatively lower luminous efficiency may also be increased for compensating the difference in luminous efficiency under other kinds of sub-pixels combinations.

In this embodiment, the first sub-pixel 221R, the second sub-pixel 221G and the third sub-pixels 221B in each of the display pixel unit 320 are preferably aligned in a rhombus formation, but not limited thereto. The first sub-pixel 221R in each of the display pixel units 320 is disposed adjacently to three first sub-pixels 221R respectively disposed in three adjacent display pixel units 320 to form a first pixel unit 330R. The second sub-pixel 221G in each of the display pixel units 320 is disposed adjacently to three second sub-pixels 221G respectively disposed in three adjacent display pixel units 320 to form a second pixel unit 330G. The third sub-pixel 221B in each of the display pixel units 320 is disposed adjacently to three third sub-pixels 221B respectively disposed in three adjacent display pixel units 320 to form a third pixel unit 330B. In other words, each of the first pixel units 330R is composed of four first sub-pixels 221R disposed adjacently to one another, each of the second pixel units 330G is composed of four second sub-pixels 221G disposed adjacently to one another, each of the third pixel units 330B is composed of four third sub-pixels 221B disposed adjacently to one another. At least some of the first sub-pixels 221R are directly connected to three first sub-pixels 221R along the row direction X and the column direction Y. At least some of the second sub-pixels 221G are directly connected to three second sub-pixels 221G along the row direction X and the column direction Y. At least some of the third sub-pixels 221B are directly connected to four third sub-pixels 221B along the row direction X and the column direction Y. Additionally, the first sub-pixels 221R in each of the first pixel units 330R are preferably aligned in a rhombus formation, the second sub-pixels 221G in each of the second pixel units 330G are preferably aligned in a rhombus formation and the third sub-pixels 221B in each of the third pixel units 330B are preferably aligned in a rhombus formation. The first pixel units 330R are disposed separately from one another, the second pixel units 330G are disposed separately from one another and at least some of the third pixel units 330B are connected with each other.

As shown in FIGS. 6-9, in the pixel structure 300 of the organic light emitting display device in this embodiment, each of the third pixel units 330B may be formed by an evaporation process employing a first mask 301M having openings 301H (as shown in FIG. 8). Each of the first pixel units 330R and each of the second pixel units 330G may be formed relatively by two evaporation processes of different organic light emitting materials and a second mask 302M having openings 302H is used in these evaporation processes. In other words, each of the openings 302H may be used to form one of the first pixel units 330R or one of the second pixel units 330G. In this embodiment, the first pixel units 330R are disposed separately from one another and the second pixel units 330G are disposed separately from one another. Therefore, a distance between the openings 302H may become longer and purposes of lowering complication of manufacturing the second mask 302M and improving stability of the evaporation process mentioned above may be achieved accordingly.

To summarize the above descriptions, in the pixel structure of the organic light emitting display device in the present invention, one of the sub-pixels in each display pixel unit and three adjacent sub-pixels in the same color are disposed adjacently to one another to compose a pixel unit. Purposes of low precision demands on masks and improved manufacturing process stability may be achieved accordingly. In addition, a number of the sub-pixels with a relatively lower luminous efficiency in each display pixel unit may be increased for compensating the difference in luminous efficiency within each display pixel unit under the condition that areas of the sub-pixels are substantially equal to one another.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of an organic light emitting display device, comprising:

a substrate; and a plurality of display pixel units, disposed on the substrate, each display pixel unit consisting of a first sub-pixel, a second sub-pixel and a third sub-pixel disposed adjoining to one another, wherein the first sub-pixel in each of the display pixel units is disposed adjoining to three first sub-pixels respectively disposed in three adjoining display pixel units to form a first pixel unit; the second sub-pixel in each of the display pixel units is disposed adjoining to three second sub-pixels respectively disposed in three adjoining display pixel units to form a second pixel unit; the third sub-pixel in each of the display pixel units is disposed adjoining to three third sub-pixels respectively disposed in three adjoining display pixel units to form a third pixel unit; the first sub-pixels in each of the first pixel units are aligned in a rhombic formation; the second sub-pixels in each of the second pixel units are aligned in a rhombic formation; and the third sub-pixels in each of the third pixel units are aligned in a rhombic formation, wherein each of the display pixel units consists of one of the first sub-pixels, one of the second sub-pixels and one of the third sub-pixels, and the first sub-pixel, the second sub-pixel and the third sub-pixel in each of the display pixel units are aligned in a delta formation.

2. The pixel structure of claim 1, wherein at least one of the first sub-pixels and at least one of the second sub-pixels are shared by two adjoining display pixel units, at least one of the second sub-pixels and at least one of the third sub-pixels are shared by two adjoining display pixel units and at least one of the first sub-pixels and at least one of the third sub-pixels are shared by two adjoining display pixel units.

3. The pixel structure of claim 1, wherein each of the first sub-pixels is a red sub-pixel, each of the second sub-pixels is a green sub-pixel and each of the third sub-pixels is a blue sub-pixel.

4. The pixel structure of claim 1, wherein the first pixel units are disposed separately from one another, the second pixel units are disposed separately from one another and the third pixel units are disposed separately from one another.

5. A pixel structure of an organic light emitting display device, comprising:

a substrate; and a plurality of display pixel units, disposed on the substrate, each display pixel unit consisting of a first sub-pixel, a second sub-pixel and a third sub-pixel disposed adjoining to one another, wherein the first sub-pixel in each of the display pixel units is disposed adjoining to three first sub-pixels respectively disposed in three adjoining display pixel units to form a first pixel unit; the second sub-pixel in each of the display pixel units is disposed adjoining to three second sub-pixels respectively disposed in three adjoining display pixel units to form a second pixel unit; the third sub-pixel in each of the display pixel units is disposed adjoining to three third sub-pixels respectively disposed in three adjoining display pixel units to form a third pixel unit; the first sub-pixels in each of the first pixel units are aligned in a rhombic formation; the second sub-pixels in each of the second pixel units are aligned in a rhombic formation; and the third sub-pixels in each of the third pixel units are aligned in a rhombic formation, wherein the first pixel units are disposed separately from one another, the second pixel units are disposed separately from one another and the third pixel units are disposed separately from one another.

\* \* \* \* \*